United States Patent
Curchod et al.

(10) Patent No.: US 11,144,012 B2
(45) Date of Patent: Oct. 12, 2021

(54) ZIRCONIA COVERING ELEMENT WITH SELECTIVE COLORING

(71) Applicant: The Swatch Group Research and Development Ltd, Marin (CH)

(72) Inventors: Loic Curchod, Lausanne (CH); Cedric Faure, Cortaillod (CH); Michel Willemin, Preles (CH); Simon Springer, Bern (CH)

(73) Assignee: The Swatch Group Research and Development Ltd, Marin (CH)

( * ) Notice: Subject to any disclaimer, the term of this patent is extended or adjusted under 35 U.S.C. 154(b) by 438 days.

(21) Appl. No.: 16/062,733

(22) PCT Filed: Nov. 17, 2016

(86) PCT No.: PCT/EP2016/078036
§ 371 (c)(1),
(2) Date: Jun. 15, 2018

(87) PCT Pub. No.: WO2017/102239
PCT Pub. Date: Jun. 22, 2017

(65) Prior Publication Data
US 2020/0264566 A1    Aug. 20, 2020

(30) Foreign Application Priority Data

Dec. 18, 2015  (EP) ..................... 15201251

(51) Int. Cl.
*G04B 45/00*    (2006.01)
*C23C 14/14*    (2006.01)
(Continued)

(52) U.S. Cl.
CPC .......... *G04B 45/0076* (2013.01); *C23C 14/14* (2013.01); *C23C 14/5873* (2013.01);
(Continued)

(58) Field of Classification Search
CPC ... A44C 27/006; C23C 14/14; C23C 14/5873; C23C 18/00; C23C 8/04; C23C 8/20;
(Continued)

(56) References Cited

U.S. PATENT DOCUMENTS 3,958,070 A * 5/1976 Schintlmeister ..... G04B 37/221
428/408
4,830,714 A    5/1989 Sirinyan et al.
(Continued)

FOREIGN PATENT DOCUMENTS

DE    24 46 431 A1    4/1976
EP    0 153 683 A2    9/1985
(Continued)

OTHER PUBLICATIONS

International Search Report dated Aug. 3, 2017 in PCT/EP2016/078036 filed Nov. 17, 2016.
(Continued)

*Primary Examiner* — James M Mellott
(74) *Attorney, Agent, or Firm* — Oblon, McClelland, Maier & Neustadt, L.L.P.

(57) ABSTRACT

The present invention relates to a covering element for a portable object made of a first material, the first material being a ceramic material having a first color, characterized in that the surface of said covering element is at least partially treated so as to exhibit at least one conversion having a different color from the first color.

15 Claims, 4 Drawing Sheets

(51) Int. Cl.
  *C23C 14/58* (2006.01)
  *G04B 37/22* (2006.01)
  *C23C 8/24* (2006.01)
  *C23C 8/04* (2006.01)
  *C23C 8/20* (2006.01)

(52) U.S. Cl.
  CPC ....... *G04B 37/226* (2013.01); *G04B 45/0015* (2013.01); *C23C 8/04* (2013.01); *C23C 8/20* (2013.01); *C23C 8/24* (2013.01)

(58) Field of Classification Search
  CPC .... C23C 8/24; C23C 8/36; G04B 9/12; G04B 37/225; G04B 37/226; G04B 45/0015; G04B 45/0076
  See application file for complete search history.

(56) References Cited

U.S. PATENT DOCUMENTS

| | | | |
|---|---|---|---|
| 2002/0132464 A1* | 9/2002 | Lee | H01L 27/222 438/618 |
| 2005/0136284 A1* | 6/2005 | Grippo | C04B 41/009 428/688 |
| 2006/0213326 A1* | 9/2006 | Gollob | C23C 4/04 75/252 |
| 2007/0228007 A1* | 10/2007 | Besson | C04B 41/009 216/65 |
| 2012/0244326 A1 | 9/2012 | Jeanrenaud et al. | |
| 2013/0098867 A1 | 4/2013 | Wei et al. | |
| 2015/0092524 A1 | 4/2015 | Verdon | |
| 2015/0122774 A1 | 5/2015 | Fernandez Ciurleo et al. | |

FOREIGN PATENT DOCUMENTS

| | | | |
|---|---|---|---|
| EP | 0 287 746 A1 | 10/1988 | |
| EP | 0 462 097 A1 | 12/1991 | |
| EP | 0 850 900 A1 | 7/1998 | |
| EP | 1160224 A1 * | 12/2001 | ............. C04B 41/89 |
| EP | 1 548 524 A1 | 6/2005 | |
| EP | 1 840 107 A1 | 10/2007 | |
| EP | 2 503 414 A1 | 9/2012 | |
| EP | 2 856 903 A1 | 4/2015 | |

OTHER PUBLICATIONS

Chinese Office Action dated Nov. 26, 2020 in Chinese Patent Application No. 201680073777.8 (with English translation), 14 pages.

* cited by examiner

Fig. 16
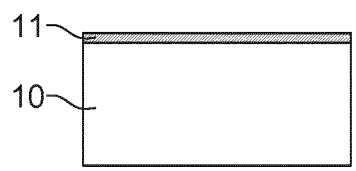
Fig. 17
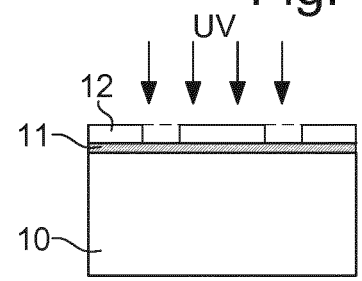
Fig. 18
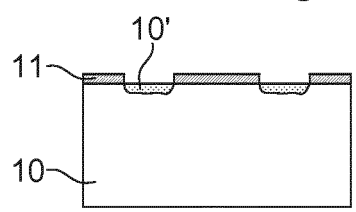
Fig. 19
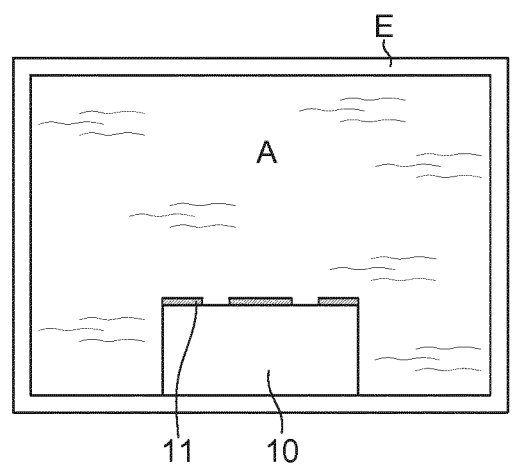
Fig. 20
Fig. 23
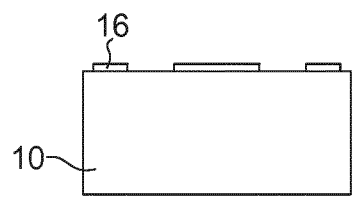
Fig. 24
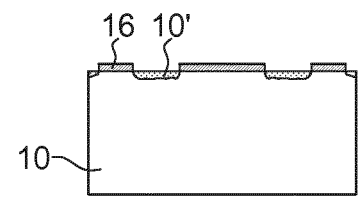

ZIRCONIA COVERING ELEMENT WITH SELECTIVE COLORING

The present invention relates to a covering element and the process for manufacturing same, made of ceramic of zirconia type, the coloring of which is selectively modified.

PRIOR ART

Portable objects such as watches, jewelry or bracelets which are partially made of ceramic are known. A known ceramic is zirconia $ZrO_2$.

It is currently possible to color this zirconia by bulk tinting it via white or black pigments, or by surface tinting it via a carburization process, converting the surface of the zirconia over a certain depth into a layer of zirconium carbide. This layer of zirconium carbide confers a platinum-colored shiny appearance upon the covering element.

In addition, a nitridation process is known, similar to said carburization process, making it possible to convert the surface of the zirconia over a certain depth into a layer of zirconium nitride, conferring a shiny appearance with a color close to yellow gold upon the covering element.

Currently, colored zirconia parts are tinted uniformly, that is to say that the whole surface is tinted, and not a zone. The drawback is therefore that current methods do not enable color variation and therefore the creation of patterns with a functional or esthetic purpose.

SUMMARY OF THE INVENTION

The aim of the present invention is to overcome the drawbacks of the prior art by proposing a ceramic covering element and the process for manufacturing same, which enable color variation and therefore the creation of patterns.

To this end, the invention relates to a covering element for a portable object made of a first material, the first material being a ceramic material having a first color, characterized in that at least one surface of said covering element is at least partially treated so as to exhibit a conversion having a different color from the first color.

This invention makes it possible to have a covering element which is colored in depth, that is to say the coloring of which is not superficial, and cannot therefore be easily effaced.

In a first embodiment, the first material is zirconia.

In a second embodiment, the surface is selectively treated to be converted into carbide.

In a third embodiment, the surface is selectively treated to be converted into nitride.

In a fourth embodiment, the surface is selectively treated to exhibit a metal deposit in localized zones.

In a fifth embodiment, the surface comprises at least one recess, the surface being treated to be converted into carbide or nitride, then polished to localize this conversion at said recess.

In a sixth embodiment, the surface comprises at least one protruding portion, the surface being treated to be converted into carbide or nitride, then polished to exclude this conversion of said protruding portion.

In a seventh embodiment, the surface is homogeneously converted into carbide or nitride then locally machined to localize the conversion to the non-machined parts.

In an eighth embodiment, the surface is selectively treated to be subjected to the diffusion of a pigment on said surface of the covering element.

The present invention also relates to a portable object comprising a such covering element.

In a first embodiment, said portable object is a timepiece comprising a case formed by a middle closed by a back and a glass, potentially provided with a bezel and buttons and/or a crown, and a wrist strap attached to the middle via two pairs of horns, and the covering element is chosen to be positioned in the list comprising the middle, the bezel, the dial, the buttons, the crown, the back, the wrist strap and the buckle.

The present invention also relates to a process for treating a covering element for a portable object made of a first material, the first material being a ceramic material having a first color, said process comprising the following steps:
  making available the covering element and placing it in a hermetically sealed chamber containing an atmosphere that is atomically loaded with a chemical element;
  locally heating, via a first focused heat source, such as, for example, a laser, the surface of the covering element such that the atoms from the atmosphere of the chamber combine locally with the surface of the first material at the location at which said surface is heated.

In a first embodiment, the atmosphere is created by dissociation of a gas via the same heat source that is locally heating the surface of the covering element.

In a second embodiment, the atmosphere is created by dissociation of a gas via a second heat source independent of that which is locally heating the surface of the covering element.

In a third embodiment, the atmosphere is created by dissociation of a gas via a second heat source independent of the first source which is locally heating the surface of the covering element, the covering element being heated homogeneously via a third heat source at a lower temperature than that enabling the combining of the atoms from the atmosphere with the first material, the first heat source serving to locally raise the temperature of the surface of the covering element in order to enable the combining of the atoms from the atmosphere with the first material.

In a first variant, said process comprises the following steps:
  making available the covering element;
  locally depositing a metal layer on the surface of said covering element;
  placing said covering element in a hermetically sealed chamber containing an atmosphere that is atomically loaded with a chemical element and heating the surface of the covering element such that the atoms from the atmosphere of the chamber combine with the surface of the first material not covered with the metal deposit.

In a first embodiment, the process also comprises a step consisting in selectively and chemically attacking the surface of said covering element in order to locally remove the metal deposit before the carburization or nitridation of the surface of said covering element.

In a second embodiment, the selective metal deposit is produced by deposition through a mask previously laid on the covering element.

In a third embodiment, the step consisting in depositing a selective metal layer consists in depositing a sacrificial layer over the whole of the surface of said covering element then in selectively etching this sacrificial layer according to a desired shape, then in depositing the metal layer over the whole of the surface of said covering element. The remaining sacrificial layer is then removed by chemical attack, leaving the metal layer only in the locations in which the sacrificial layer has been selectively etched.

In a fourth embodiment, the selective metal deposit is produced by deposition followed by a step of laser structuring of the surface of said covering element.

In a fifth embodiment, the selective metal deposit is produced by deposition followed by a step of photolithography of the surface of said covering element.

In a second variant, said process comprises the following steps:
making available the covering element;
treating said covering element by placing it in a hermetically sealed chamber containing an atmosphere that is atomically loaded with a chemical element and heating the surface thereof such that the atoms from the atmosphere of the chamber combine with the surface of the first material,
characterized in that said process also comprises, prior or subsequent to the step consisting in treating said covering element, a step of structuring the covering element, making it possible to create a relief on the surface thereof.

In a first embodiment, when the step of structuring the covering element is carried out subsequent to the step consisting in treating the surface of said covering element, the structuring removes the sacrificial layer over the structured zones and thereby locally reveals the color of the core of said zirconia covering element.

In a second embodiment, the process also comprises, when the step of structuring the covering element is carried out prior to the step consisting in treating the surface of said covering element, a step of polishing in order to remove the surface layer on the top portion of the surface in relief of the covering element and to thereby locally reveal the color of the core of said zirconia covering element.

In a third variant, said process comprises the following steps:
making available the covering element;
depositing a second material on the surface of said covering element; said second material comprising color pigments;
heating the covering element so as to melt or diffuse the pigments in the surface of the covering element.

In a first embodiment, said step consisting in heating the covering element is carried out in a hermetically sealed chamber containing an atmosphere that is atomically loaded with a chemical element such that the atoms from the atmosphere of the chamber combine with the surface of the first material that is not covered by the second material.

BRIEF DESCRIPTION OF THE FIGURES

The aims, advantages and features of the invention will become more clearly apparent in the following detailed description of at least one embodiment of the invention, given solely by way of nonlimiting example and illustrated by the appended drawings, in which:

FIGS. 6 to 20 schematically show a second embodiment of the process according to the invention;

FIGS. 23 and 24 schematically show a fourth embodiment of the process according to the invention.

DETAILED DESCRIPTION

Figure 1:
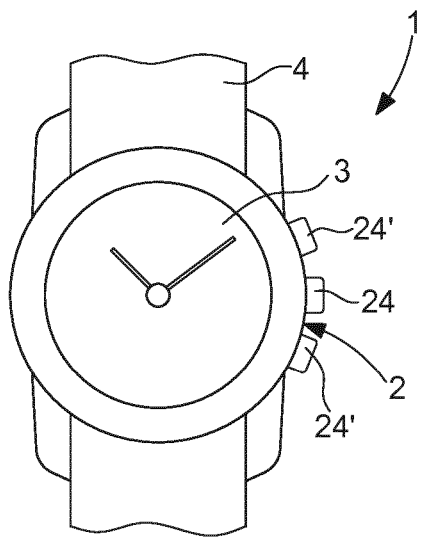
FIGS. 1 and 2 schematically show the portable object according to the invention.
Figure 2:
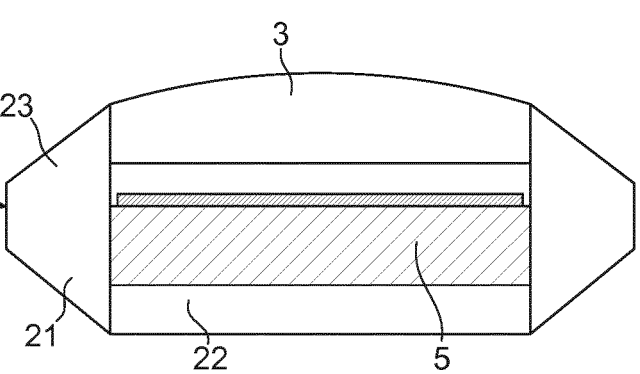

FIGS. 1 and 2 describe a portable object 1 according to the invention. An example of a portable object according to the invention is a timepiece. Such a timepiece comprises a case 2 formed by a middle 21 closed by a back 22 and a glass 3. This case 2 contains an electronic or mechanical or electromechanical timepiece movement 5. This portable object may also comprise a wrist strap 4 comprising two bands 4' or a plurality of links. A covering element according to the invention is therefore included in the list comprising the middle, the back, the wrist strap, the fold-out clasp or the buckle—prong required to close the wrist strap. Of course, the watch may also comprise a bezel 23 which rotates or does not rotate and which is integrated or not integrated into the middle, and also control means such as a crown head 24 or push buttons 24'. The middle 21 may be provided with an integrated or added bezel.

The covering element according to the invention is made of a first material. This material is chosen to be of the ceramic type. The ceramic used here is zirconium oxide $ZrO_2$, also referred to as zirconia.

Advantageously according to the invention, this ceramic covering element 10 is surface treated. This surface treatment is carried out so as to be selective, that is to say that the covering element is not necessarily treated over the whole of the surface thereof. This surface treatment is used in order to obtain improved color diversity or to have a greater possibility of decoration with patterns.

Figure 3:
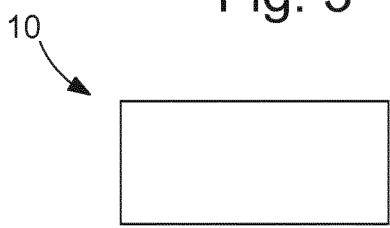
FIGS. 3 to 5 schematically show a first embodiment of the process according to the invention.
Figure 4:
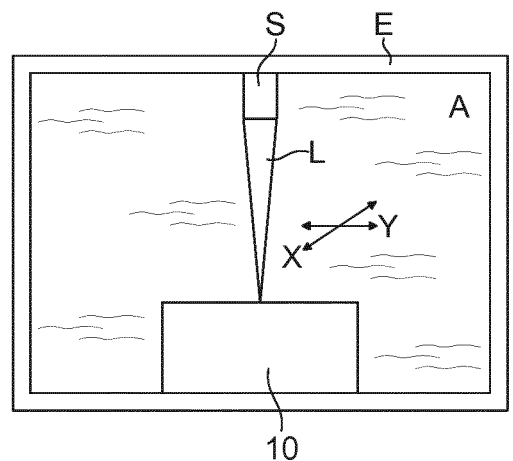
Figure 5:
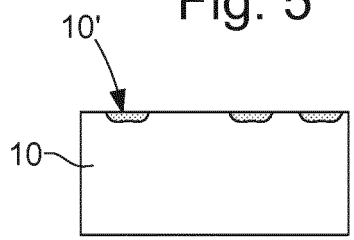
Figure 6:
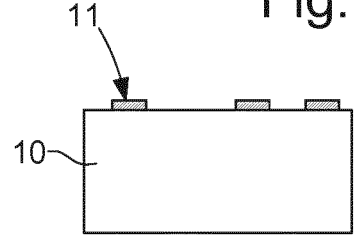

In a first embodiment which can be seen in FIGS. 3 to 5, the treatment according to the present invention consists of a selective caburization/nitridation of the covering element 10 by a focused heat source such as a laser. As a reminder, carburization/nitridation consists in activating the part to be carburized/nitrided by heating it in an atmosphere that is loaded with carbon or nitrogen atoms.

The first step therefore consists in making available the covering element 10 which will be treated, and placing it in a chamber E. This chamber E is hermetically sealed and contains an atmosphere A loaded with carbon C or nitrogen N atoms, depending on whether a carburization or a nitridation is being carried out. This atmosphere A loaded with carbon C or nitrogen N atoms may be created by dissociation of compounds such as methane, $CH_4$, dinitrogen $N_2$ or ammonia $NH_3$. This dissociation is carried out by heating the base compounds to break the molecular bonds and to obtain atomic atmospheres.

The second step consists in selectively carburizing or nitriding the covering element 10 by activating, by heating, the surface of the part in chosen zones 10'. In order to be able to selectively heat said surface in the chosen zones 10', a focused heat source S, e.g. a laser providing a laser beam L, is used. This laser beam is preferentially a pulsed laser beam. The surface of the covering element 10 is then locally heated in the zones 10' at a temperature of between 700 and 1100° C. for a duration of 30 to 180 minutes. Under the effect of this temperature, the carbon or nitrogen atoms of the atmosphere A of the chamber E combine with the zirconia surface in the zones 10' of the covering element 10. This is a conversion of the surface of the zones 10' of the covering element 10 over a small thickness, of the order of 10 to 500 nm, into zirconium carbide or zirconium nitride, having a metallic appearance that is platinum in color, or close to yellow gold in color, respectively. This is therefore a surface modification of the structure of the zirconia to give a new crystallographic structure corresponding to that of zirconium carbide/zirconium nitride and not an added coating liable to be torn off or to become detached from the surface of the article, especially when the latter is subjected to heavy wear conditions or impacts. More particularly, the surface layer which has the structure of zirconium carbide or of zirconium nitride extends from the surface to a depth of between 10 and 500 nm.

In order to carry out the different steps, several modes of execution may be provided.

In a first mode of execution, the dissociation of the gases to obtain an atmosphere loaded with carbon C or nitrogen N atoms and the local activation of the surface of said covering element 10 use the same laser.

In a second mode of execution, the dissociation of the gases to obtain an atmosphere loaded with carbon C or nitrogen N atoms is carried out by a first heat source while the local activation of the surface of said covering element 10 uses the laser.

In a third mode of execution, the dissociation of the gases to obtain an atmosphere loaded with carbon C or nitrogen N atoms is carried out by a first heat source, the covering element is heated via a second heat source, while the local activation of the surface of said covering element uses the laser. This third mode of execution makes it possible to preheat the covering element 10 homogeneously and to have a smaller temperature difference in the zone of the surface of the covering element 10 treated by the focused heat source.

An advantage of this first embodiment is that it readily enables selective activation of the surface of the covering element 10. Indeed, a laser beam has the advantage of having an adjustable beam diameter.

In a second embodiment which can be seen in FIGS. 6 to 20, the principle used is selective metallization.

The first step therefore consists in making available the covering element 10 and in applying a metallization 11 to the surface thereof. This metallization 11 is selective, that is to say that it is carried out on the zone(s) that it is desired not to carburize or to nitride. This metal deposit is made for example from a material from the list including chromium, tantalum, molybdenum, tungsten, niobium, titanium, silicon and boron, and is produced according to several modes of execution.

Figure 7:
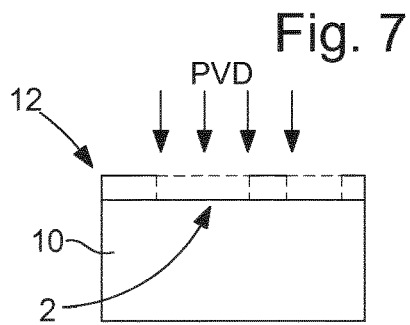
Figure 8:
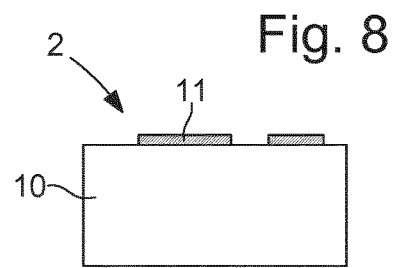
Figure 9:
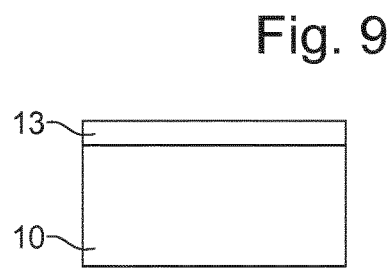
Figure 10:
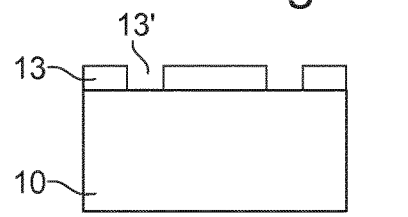
Figure 11:
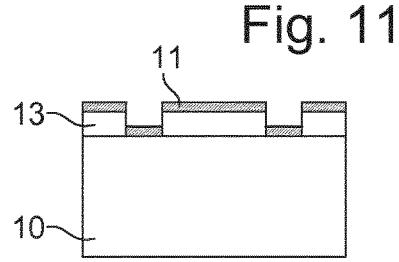
Figure 12:
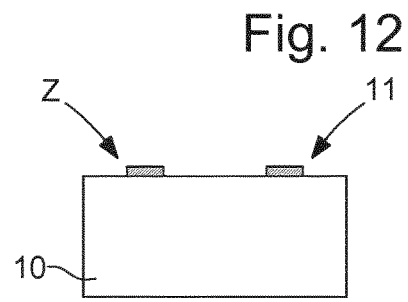

In a first mode of execution which can be seen in FIGS. 7 and 8, the metallization is carried out by masking the surface of the covering element 10 via a mask 12, followed by metal deposition via a process of the physical vapor deposition PVD type. Thus, only the zones Z not covered by the mask 12 receive the metal deposit 11.

In a second mode of execution which can be seen in FIGS. 9 to 12, the metallization is carried out by depositing a sacrificial layer 13 such as a layer of capton or a layer of ink or of lacquer or of resin on the surface of the covering element. This layer 13 is then selectively etched depending on the desired esthetic and reveals apertures 13'. The whole surface is then covered with a metal layer 11 by PVD deposition, the layer being deposited both on the sacrificial layer 13 and in the recesses 13' made in said sacrificial layer. Finally, the sacrificial layer 13 is removed by chemical attack, leaving the metal layer 11 only on the zones Z corresponding to the locations of the recesses 13' of the removed sacrificial layer.

Figure 13:
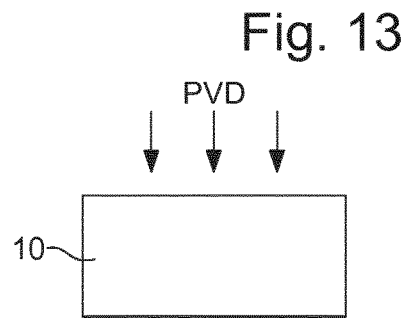
Figure 14:
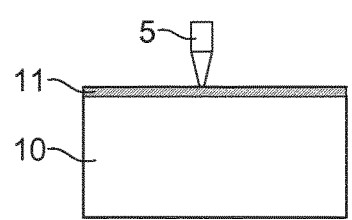
Figure 15:
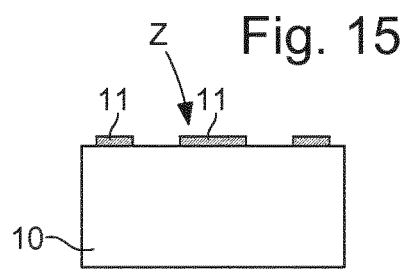

In a third mode of execution which can be seen in FIGS. 13 to 15, the selective metal deposition consists in depositing the metal 11 over the whole of the surface of the covering element 10 in order to subsequently use a focused heat source S such as a laser to structure the deposited metal layer 11. This structuring consists in pickling the surface of the covering element 10 to remove the metal layer 11 at the undesired locations and leaving the metal layer 11 at the desired zones Z.

In a fourth mode of execution which can be seen in FIGS. 16 to 18, the selective metal deposition consists in depositing the metal over the whole of the surface of the covering element 10. Following this, a step of photolithography with a mask 12 is used to locally modify the metal layer deposited. This local modification is followed by a step of chemical attack to remove the metal layer 11 at the undesired locations and leave it at the desired zones Z.

Once this metal deposition has been carried out, the following step consists in carburizing or nitriding the covering element 10 with the metal layer 11 on the zones Z of the surface thereof. For this purpose, the covering element 10 is placed in a chamber E which contains an atmosphere A loaded with carbon C or nitrogen N atoms, as indicated in FIG. 19. The whole assembly is then heated using a plasma technique as described in patent EP 0 850 900. In this case, the metal deposit 11 serves as shield, preventing the carburization/nitridation of the zones covered by this metal layer 11 and enabling conversion in the zones 10' that are not covered, as can be seen in FIG. 20.

In the case in which the covering element 10 is made of white zirconia, the reduction occurring during said carburization/nitridation gives rise to the appearance of a gray color of the zirconia under the PVD layer. In the case of black zirconia, the covering element 10 retains its black color, enabling an additional step in which the metal deposit 11 is chemically dissolved to reveal the black-colored zirconia. A contrast is therefore obtained between the black zirconia and the rest of the carburized or nitrided covering element 10.

Figure 21:
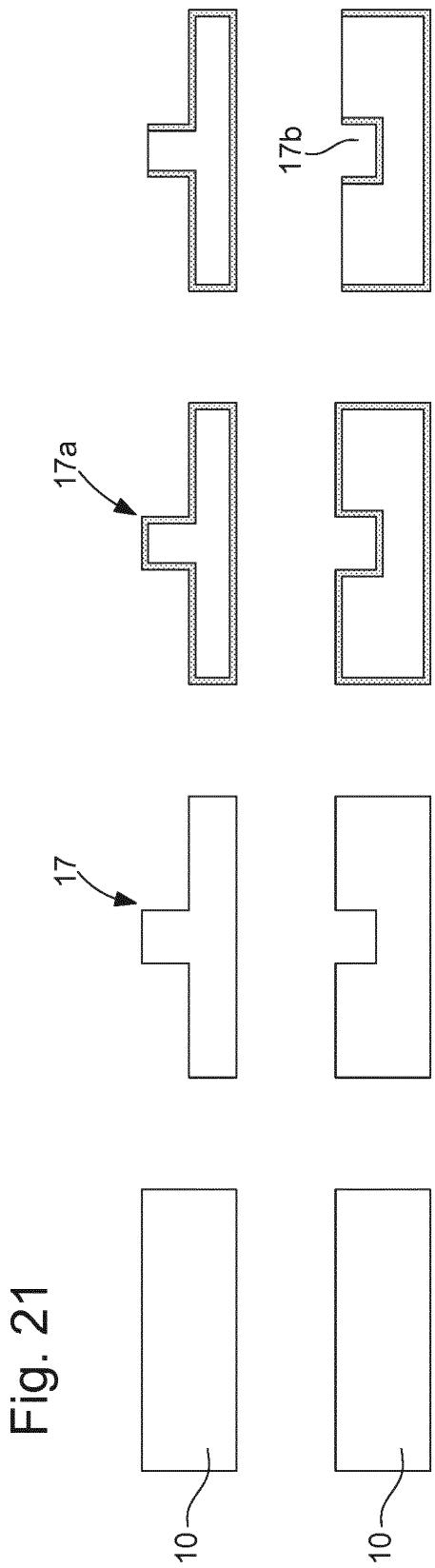
FIGS. 21 and 22 schematically show a third embodiment of the process according to the invention.
Figure 22:
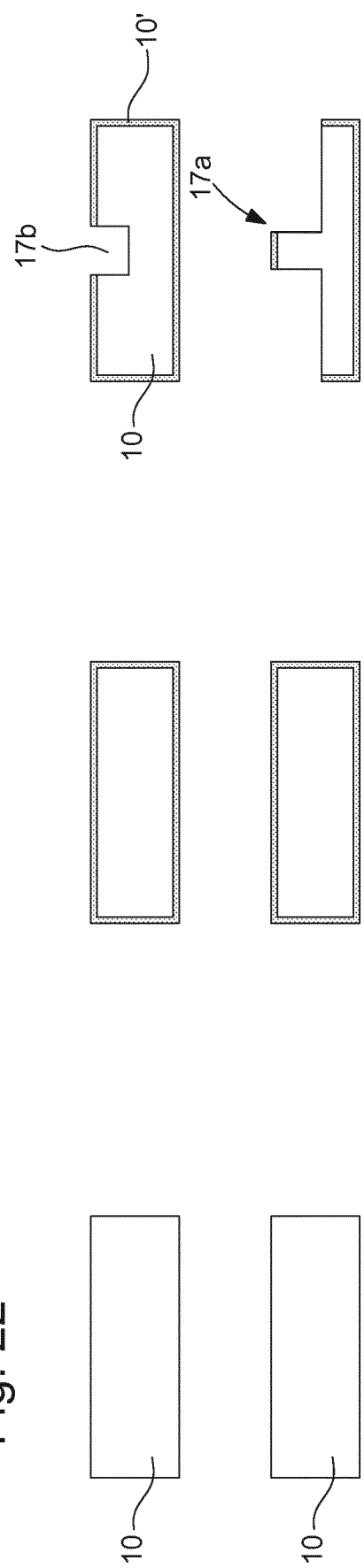

In a third embodiment which can be seen in FIGS. 21 and 22, the selective coloring of the covering element 10 uses the principle of carburization/nitridation and of structuration.

In a first mode of execution which can be seen in FIG. 21, the first step consists in making available the zirconia covering element 10. Preferentially, the zirconia used is black zirconia. This first step also consists in structuring this covering element. This structuring may be carried out in two different ways: during the manufacture of the covering element or subsequent to this manufacture. These structurings 17 are in the form of depressions 17b or of protruding portions 17a.

In the case in which the structuring is carried out during the manufacture of the covering element 10, it will be understood that this manufacture consists in mixing powders with one another in order to subsequently place them in a mold and sinter them, that is to say subject them to a temperature and a pressure such that a conversion occurs. Thus, the mold in which the powders are placed may have a shape including the desired structurings 17.

In the case in which the structuring is carried out subsequent to the manufacture of the covering element 10, mechanical or laser machining can be envisioned.

In a second step, the covering element is carburized or nitrided. For this purpose, the structured covering element 10 is placed in a chamber E which contains an atmosphere A loaded with carbon or nitrogen atoms. The whole assembly is then heated via plasma for a determined duration, in order to convert the surface of the covering element into zirconium carbide or nitride, respectively. This carburization/nitridation is therefore carried out over the whole surface of the covering element 10.

In a third step, the covering element 10 undergoes a polishing step. This polishing step consists in removing the surface layer of the covering element. The covering element is provided with structurings 17 in the form of depressions 17b or of protruding portions 17a, these depressions 17b or protruding portions 17a also being carburized/nitrided. Consequently, the polishing does not affect the whole of the surface of the covering element 10. Indeed, in the case in which the structurings 17 are recesses 17b, the polishing operation leaves the carburization/nitridation in the recesses. In the case in which the structurings 17 are protruding portions 17a, the polishing operation removes the carburization/nitridation at these protruding portions 17a.

Thus, a contrast is obtained between the polished portion of the covering element 10 and the carburized/nitrided portion.

In a second mode of execution which can be seen in FIG. 22, the first step consists in making available the zirconia covering element 10.

In a second step, said covering element is carburized or nitrided. For this purpose, the structured covering element 10 is placed in a chamber E which contains an atmosphere A loaded with carbon or nitrogen atoms. The whole assembly is then heated via a plasma for a determined duration, in order to convert the surface of the covering element into zirconium carbide or nitride, respectively. This carburization/nitridation is therefore carried out over the whole surface of the covering element 10.

In a third step, the covering element 10 undergoes a structuring step. This step consists in removing material from the covering element. For this purpose, mechanical or laser machining is used. The material may be removed so as to locally remove only the surface layer of 10 to 500 nm which is converted into zirconium carbide or nitride. Nonetheless, the material may be removed so as to create a visible recess in order to associate the contrast with a relief, this relief being able to accentuate said contrast.

In a fourth embodiment which can be seen in FIGS. 23 and 24, the selective coloring of the covering element 10 uses pigments, for example enamels or inks. This embodiment consists, in a first step, in making available the covering element 10.

In a second step, it is necessary to make available colored enamels or inks 16. These enamels are in the form of an oil comprising a powder of colored pigments.

These inks or enamels 16 are then arranged on the surface of the covering element 10 according to the desired pattern. For this purpose, a printing machine is used.

In a third step, the covering element 10 provided with selective deposition of inks or enamels 16 undergoes a diffusion step. This diffusion step consists in heating the covering element in order to fix the color.

According to a first mode of execution, the diffusion step consists in annealing to fix the color. This annealing consists in placing the covering element in an oven. For enamels, the oven temperature reaches approximately 800° C. At this temperature, the oil in which the pigments are suspended evaporates, while the pigments are melted at the surface or diffuse in the surface of the covering element.

According to a second mode of execution, the diffusion step consists of carburization/nitridation. This step then consists in placing the covering element provided with the selective deposit of inks or enamels 16 in a chamber E which is hermetically sealed and contains an atmosphere A loaded with carbon C or nitrogen N atoms, depending on whether a carburization or a nitridation is being carried out, respectively. The surface of the part is activated by plasma heating at a temperature of between 700 and 1100° C. for a determined duration. Under the effect of this temperature, the carbon or nitrogen atoms of the atmosphere A of the chamber E combine with the zirconia surface of the covering element 10. This is a conversion of the covering element over a small thickness, of the order of 10 to 500 nm, the zirconia (zirconium oxide) in the outer region of the covering element being converted into zirconium carbide or zirconium nitride having a metal appearance with a platinum color or color close to yellow gold, respectively. Simultaneously, the heat from the oven also makes it possible to heat the inks or enamels 16 so as to melt them at the surface or cause them to diffuse in the surface of the covering element 10. A covering element 10 is thus obtained, the surface of which is carburized or nitrided in the zones 10' and colored in the zones in which the inks or enamels 16 were deposited, as can be seen in FIG. 24.

This technique advantageously makes it possible to have a contrast between the carburized/nitrided portion and the colored portion.

It will be understood that diverse modifications and/or improvements and/or combinations that are obvious to those skilled in the art may be introduced into the various embodiments of the invention presented above without departing from the scope of the invention defined by the appended claims.

Thus, it will be understood that the covering element may be treated at various locations on the surface thereof.

The invention claimed is:

1. A process for treating a covering element for a portable object, the covering element comprising zirconia, said process comprising:
    making available the covering element and placing the covering element in a hermetically sealed chamber (E) comprising an atmosphere that is atomically loaded with a chemical element:
    selectively carburizing or nitriding the covering element by activating and locally heating, via a first focused heat source (S), the surface of the covering element such that the atoms from the atmosphere of the chamber combine locally with a portion of the zirconia surface to form a pattern of zirconium carbide or of zirconium nitride.

2. The treatment process as claimed in claim 1, wherein the atmosphere is created by dissociation of a gas via a second heat source.

3. The treatment process as claimed in claim 1, wherein the atmosphere is created by dissociation of a gas via a second heat source, the covering element being heated at a lower temperature than the activation temperature for combining the atoms from the atmosphere with the zirconia surface via a third heat source.

4. The treatment process as claimed in claim 1, wherein the surface of the covering element is locally heated at a temperature of between 700 and 1100° C. for a duration of 30 to 180 minutes.

5. The treatment process as claimed in claim 1, wherein a surface layer which has the structure of zirconium carbide or of zirconium nitride is obtained, and extends from the surface to a depth of between 10 and 500 nm.

6. A process for treating a covering element for a portable Object made of zirconia, said process comprising:
    making available the covering element;
    locally depositing a metal layer on the surface of said covering element;
    placing said covering element in a hermetically sealed chamber (E) comprising an atmosphere that is atomically loaded with a chemical element and selective carburizing or nitriding the covering element by activating and locally heating the surface of the covering element such that the atoms from the atmosphere of the chamber combine with the surface of a first material not covered with the metal deposit, to form a pattern of zirconium carbide or of zirconium nitride.

7. The treatment process as claimed in claim 6, further comprising selectively and chemically attacking the surface of said covering element in order to remove the metal deposit.

8. The treatment process as claimed in claim 6, wherein a selective metal deposit is produced by deposition through a mask previously laid on the covering element.

9. The treatment process as claimed in claim 6, wherein the depositing of the metal layer consists in:
  depositing a sacrificial layer over the whole of the surface of said covering element;
  selectively etching the sacrificial layer according to a desired shape; and then
  depositing the metal layer over the whole of the surface of said covering element, the remaining sacrificial layer then being removed by chemical attack, thereby leaving the metal layer in the locations in which the sacrificial layer was previously etched.

10. The treatment process as claimed in claim 6, wherein a selective metal deposit is produced by deposition followed by laser structuring of the surface of said covering element.

11. The treatment process as claimed in claim 10, wherein the metal deposit comprises at least one selected from the group consisting of chromium, tantalum, molybdenum, tungsten, niobium, titanium, silicon and boron.

12. The treatment process as claimed in claim 6, wherein a selective metal deposit is produced by deposition followed by photolithography of the surface of said covering element.

13. A process for treating a covering element for a portable object comprising zirconia, said process comprising:
  making available the covering element;
  treating said covering element by placing the covering element in a hermetically sealed chamber comprising an atmosphere that is atomically loaded with a chemical element and selectively carburizing or nitriding the covering element by activating and locally heating the surface thereof such that the atoms from the atmosphere of the chamber combine with the surface of the first material,
  wherein the process further comprises, prior or subsequent to the treating of said covering element, structuring the covering element, making it possible to create a relief on the surface thereof and to reveal the color of the zirconia contrasting with a carburized or nitrided surface color, in order to form a pattern of zirconium carbide or of zirconium nitride.

14. The treatment process as claimed in claim 13, further comprising, when the structuring of the covering element is carried out prior to the treating of said covering element:
  polishing in order to remove the carburized/nitrided surface layer on the portions protruding from the surface in relief of the covering element.

15. A process for treating a covering element for a portable Object comprising zirconia, said process comprising:
  making available the covering element;
  locally depositing ink or enamel pigments on the surface of the covering element; and
  placing the covering element in a hermetically sealed chamber comprising an atmosphere that is loaded with carbon or nitrogen atoms, and selectively carburizing or nitriding the covering element by activating and locally heating the surface thereof, so as to form a pattern of zirconium carbide or of zirconium nitride around an ink or enamel pattern.

* * * * *